United States Patent
Lou

(10) Patent No.: US 8,035,405 B2
(45) Date of Patent: Oct. 11, 2011

(54) SEMICONDUCTOR DEVICES TESTING APPARATUS WITH TEMPERATURE-ADJUSTING DESIGN

(75) Inventor: Choon Leong Lou, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 289 days.

(21) Appl. No.: 12/401,908

(22) Filed: Mar. 11, 2009

(65) Prior Publication Data

US 2010/0052720 A1    Mar. 4, 2010

(30) Foreign Application Priority Data

Sep. 4, 2008  (TW) ................................ 97133854 A

(51) Int. Cl.
*G01R 31/00* (2006.01)
(52) U.S. Cl. .......... 324/750.03; 324/750.08; 324/750.26
(58) Field of Classification Search .................... None
See application file for complete search history.

(56) References Cited

U.S. PATENT DOCUMENTS

| | | | |
|---|---|---|---|
| 4,820,976 A | 4/1989 | Brown | |
| 5,325,052 A * | 6/1994 | Yamashita | 324/750.08 |
| 6,468,098 B1 | 10/2002 | Eldridge | |
| 6,906,543 B2 * | 6/2005 | Lou et al. | 324/750.08 |
| 7,046,025 B2 * | 5/2006 | Schneidewind et al. | 324/750.03 |
| 7,576,553 B2 * | 8/2009 | Lou et al. | 324/750.03 |
| 7,791,363 B2 * | 9/2010 | Lou | 324/754.01 |

* cited by examiner

*Primary Examiner* — Vinh Nguyen
(74) *Attorney, Agent, or Firm* — WPAT, P.C.; Anthony King

(57) ABSTRACT

A probing apparatus includes a housing, a device holder positioned in the housing and configured to receive a device under test, a temperature-controller positioned in the device holder, a platen positioned on the housing and configured to retain at least one probe, and a flow line positioned in the platen, wherein the flow line is configured to flow a fluid therein to adjust the temperature of the platen.

22 Claims, 5 Drawing Sheets

SEMICONDUCTOR DEVICES TESTING APPARATUS WITH TEMPERATURE-ADJUSTING DESIGN

BACKGROUND OF THE INVENTION (A) Field of the Invention

The present invention relates to a probing apparatus for semiconductor devices, and more particularly, to a probing apparatus for semiconductor devices using pressurized fluid to control the temperature uniformity of the platen with objects positioned thereon.

(B) Description of the Related Art

Generally, it is necessary to test the electrical characteristics of integrated circuit devices at the wafer level to check whether the integrated circuit device satisfies the product specification. Integrated circuit devices with electrical characteristics satisfying the specification are selected for the subsequent packaging process, and the other devices are discarded to avoid additional packaging cost. Test time and cost are much increased with the increasing test requirements and conditions especially increasing temperature ranges. The time required for the test system to be stabilized increases with increasing temperature and larger wafer size. The cause is result of requiring test electronics, probe station, probe units and probes to stable at the test temperature.

To initiate the electrical testing, the integrated circuit device is positioned on a device holder with temperature-controlling unit, which adjusts the temperature of the device under test according to the predetermined testing temperature. This testing is not conducted until the temperature of the testing environment is stable. Unstable test environment will result in probe movement on the contacting area of the device under test and the probe may moved out of the contacting areas (probe pads). To probe different devices during the electrical testing, the device holder has to move the wafer under test such that the probe of the probe card can contact different integrated circuit devices or different pads of the same integrated circuit device. However, the location of the device holder under higher temperature may cause the temperature distribution of the testing environment, leading to the physical dimension changes of the surrounding parts such as the platen, the probe card, or the probes. The physical dimension changes can be the deformation of the surrounding objects due to localized thermal expansion of heated parts and shrinkage of cooler parts. This alters the relative positions of the probes against the contact area on the wafer, which precludes further electrical testing if the probes are not in contact with the contacting areas. Consequently, after the movement of the device holder, the electrical testing cannot be performed until the temperature of the testing environment is stable and the probe are re-aligned to make contact with the contacting areas again so as to ensure the accuracy of the testing result. However, waiting for the testing environment to reach the stable status again consumes time and increases the testing cost.

U.S. Pat. No. 4,820,976, U.S. Pat. No. 6,468,098 and U.S. Pat. No. 6,906,543 disclose probe cards equipped with temperature-adjusting mechanisms, which can only adjust the temperature of the circuit board of the probe card locally, so as to prevent the material of the probe card from undergoing physical dimensional change due to the temperature variation. However, the temperature-adjusting techniques disclosed in these patents cannot prevent the other parts such as the platen or probe unit from physical change due to the temperature variation of the temperature control unit. Changes in test temperature or movement of the wafer will alter the relative positions of the probe against the contacting area such as the probe card and the probe on the platen and the probe pads on the wafer, which precludes further electrical testing.

SUMMARY OF THE INVENTION

One aspect of the present invention provides a probing apparatus for semiconductor devices using the pressurized fluid to control the temperature uniformity of the platen with objects positioned thereon so as to reduce the influence of the local thermal expansion of the platen due to the local temperature variation, which may alter the relative positions of the objects on the platen.

A probing apparatus for semiconductor devices according to this aspect of the present invention comprises a housing configured to define a testing chamber, a device holder positioned in the housing and configured to receive at least one device under test, a temperature-controller positioned in the device holder and configured to control the temperature of the device holder, a platen positioned on the housing and configured to retain at least one probe, and at least one flow line positioned in the platen, wherein the flow line is configured to flow a fluid therein to adjust the temperature of the platen.

Another aspect of the present invention provides a probing apparatus for semiconductor devices comprising a platen positioned on a testing chamber and configured to retain at least one probe, and at least one flow line positioned in the platen, wherein the platen includes an opening, the probe contacts a device under test through the opening, and the flow line is configured to flow a fluid therein to adjust the temperature of the platen.

According to the prior art, the movement of the device holder causes temperature variation in the testing environment, which leads to physical dimension change of the objects in the testing environment, altering the relative positions of the objects that results in accurate test results or in the worst case, a shift in the probe outside that of the probe pads precluding further electrical testing. Consequently, after the movement of the device holder, the electrical testing cannot be performed until the temperature of the testing environment stabilizes with almost no more thermal expansion of the system so as to ensure the accuracy of the testing result.

In contrast, the embodiment of the present invention introduces the fluid in the flow line positioned in the platen to limit the temperature variation of the platen to within an allowable range. As a result, the positions of the objects on the platen are not affected by the local thermal expansion of the platen due to temperature variation.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
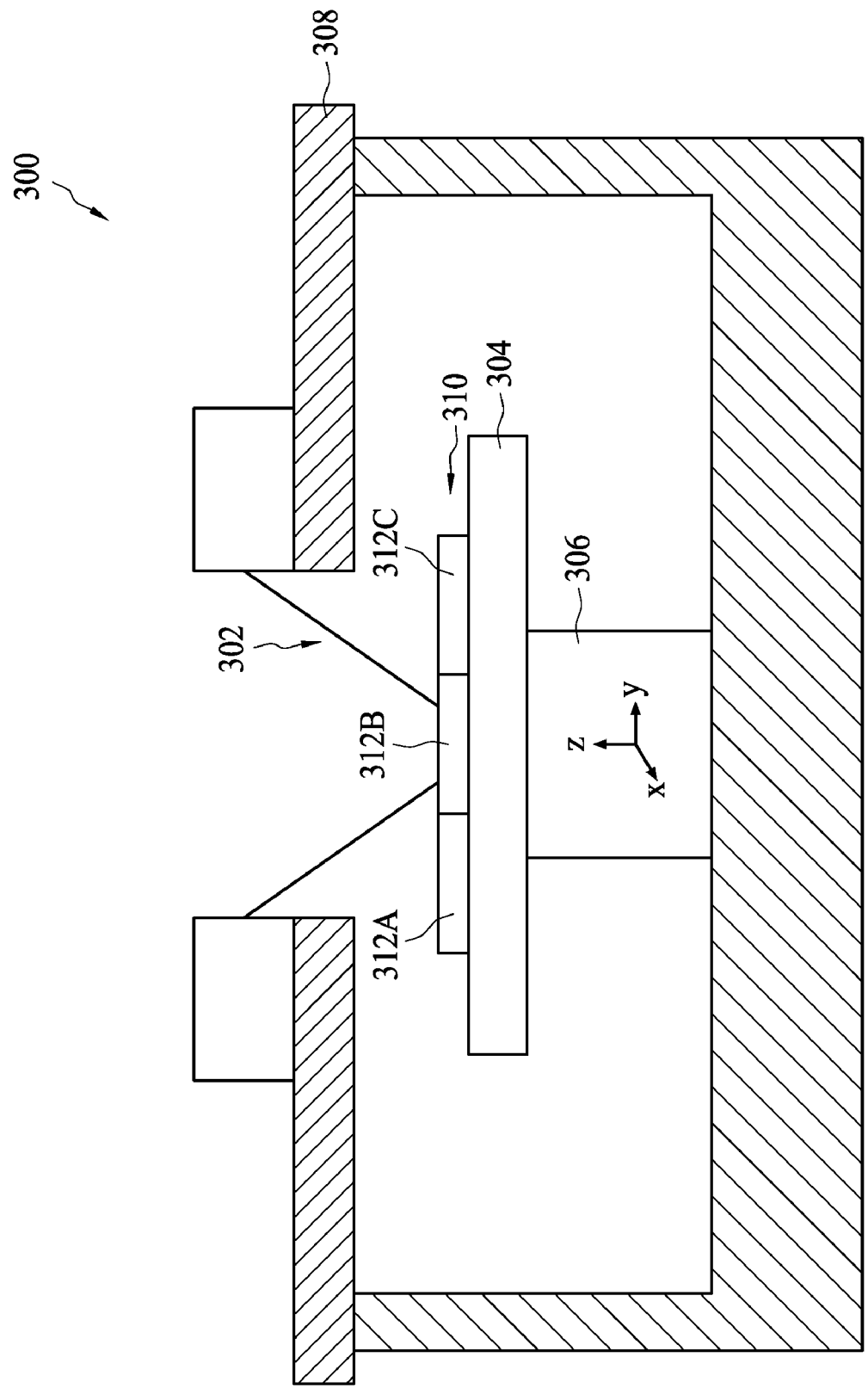
FIG. 1 and FIG. 2 illustrate a traditional probe system.
Figure 2:
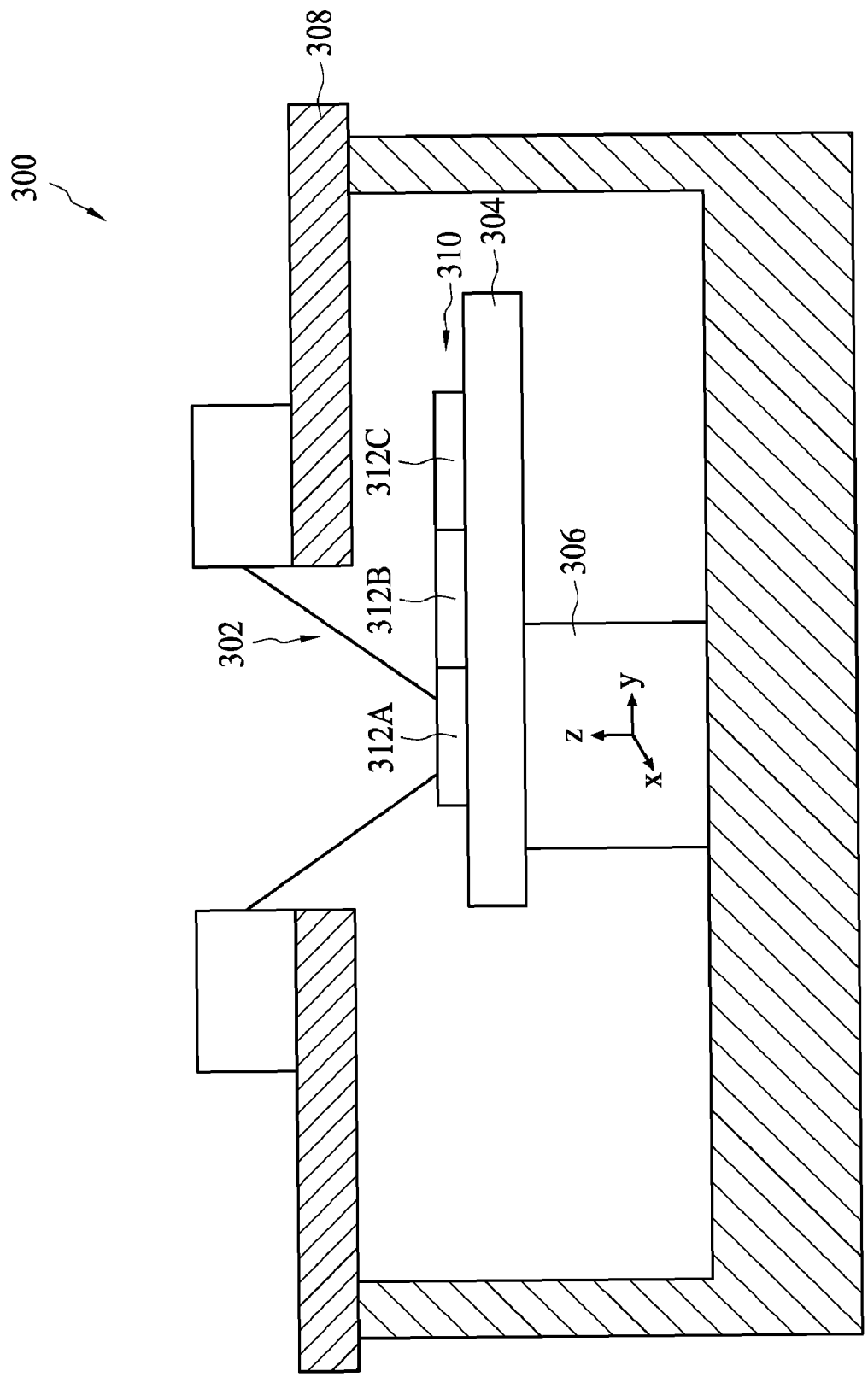

FIG. 1 and FIG. 2 illustrates a traditional probe system 300 using probe cards or probe units 302 for contacting the wafer 310 on a temperature-controlling unit 304. The temperature-controlling unit 304 holding the wafer 310 with device 312A-312C under test can move in three axes—X, Y and Z by the three axes stage 306. The time to stable probe contact will increase with changing temperature of the temperature-controlling unit 304 or the movement of the temperature-controlling unit 304. Change of temperature of the temperature-controlling unit 304 will require the adjoining parts such as the platen 308, probe card, and probes 302 to expand and stabilize with the changing temperature. On the other hand, with the movement of the temperature-controlling unit 304 as shown in FIG. 2, the proximity of the adjoining parts will change and thus requiring it to be stabilized before contacting to the wafer 310.

Figure 3:
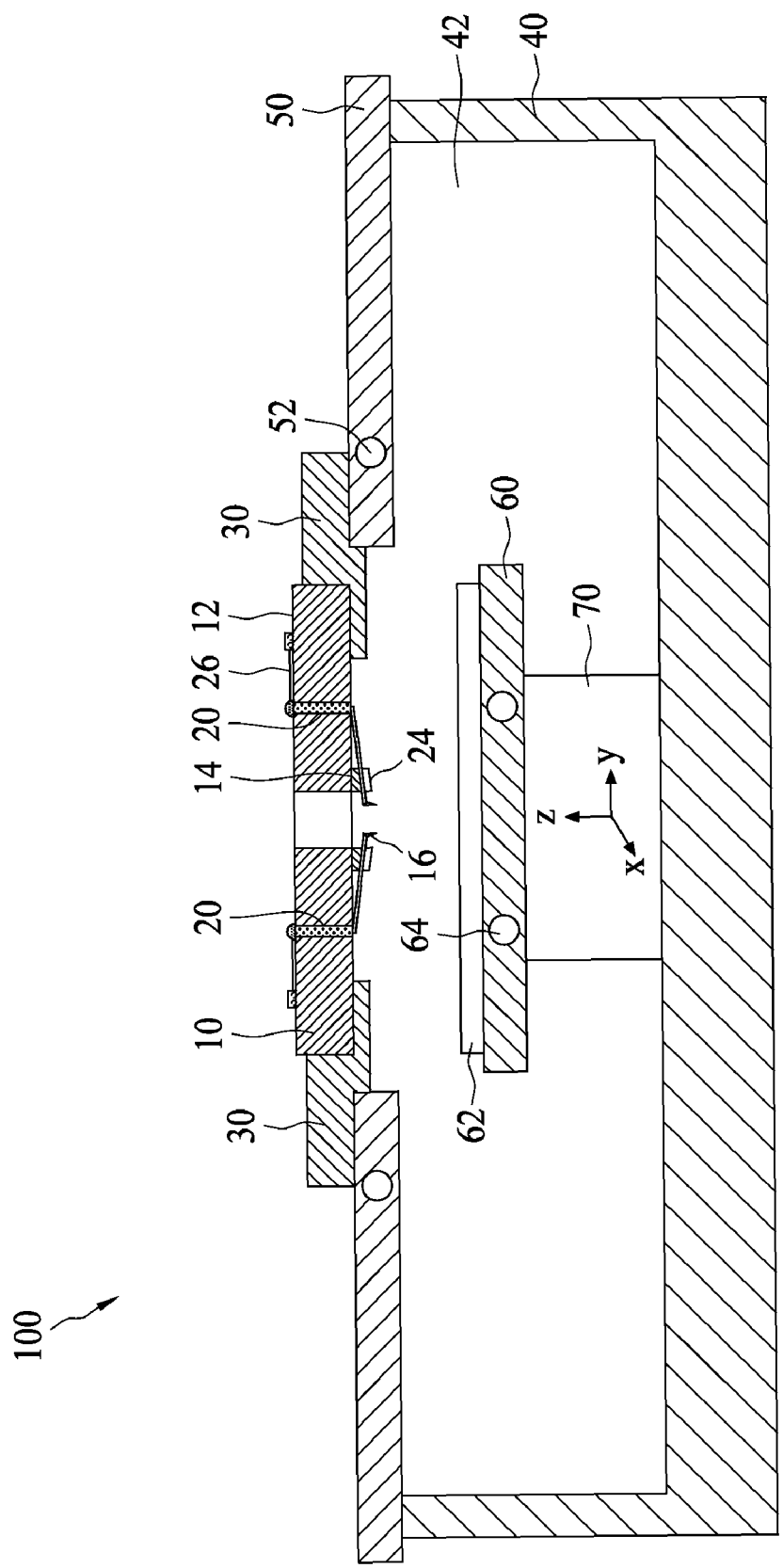
FIG. 3 illustrates a probing apparatus with adaptation of probe card as the contacting unit.
Figure 4:
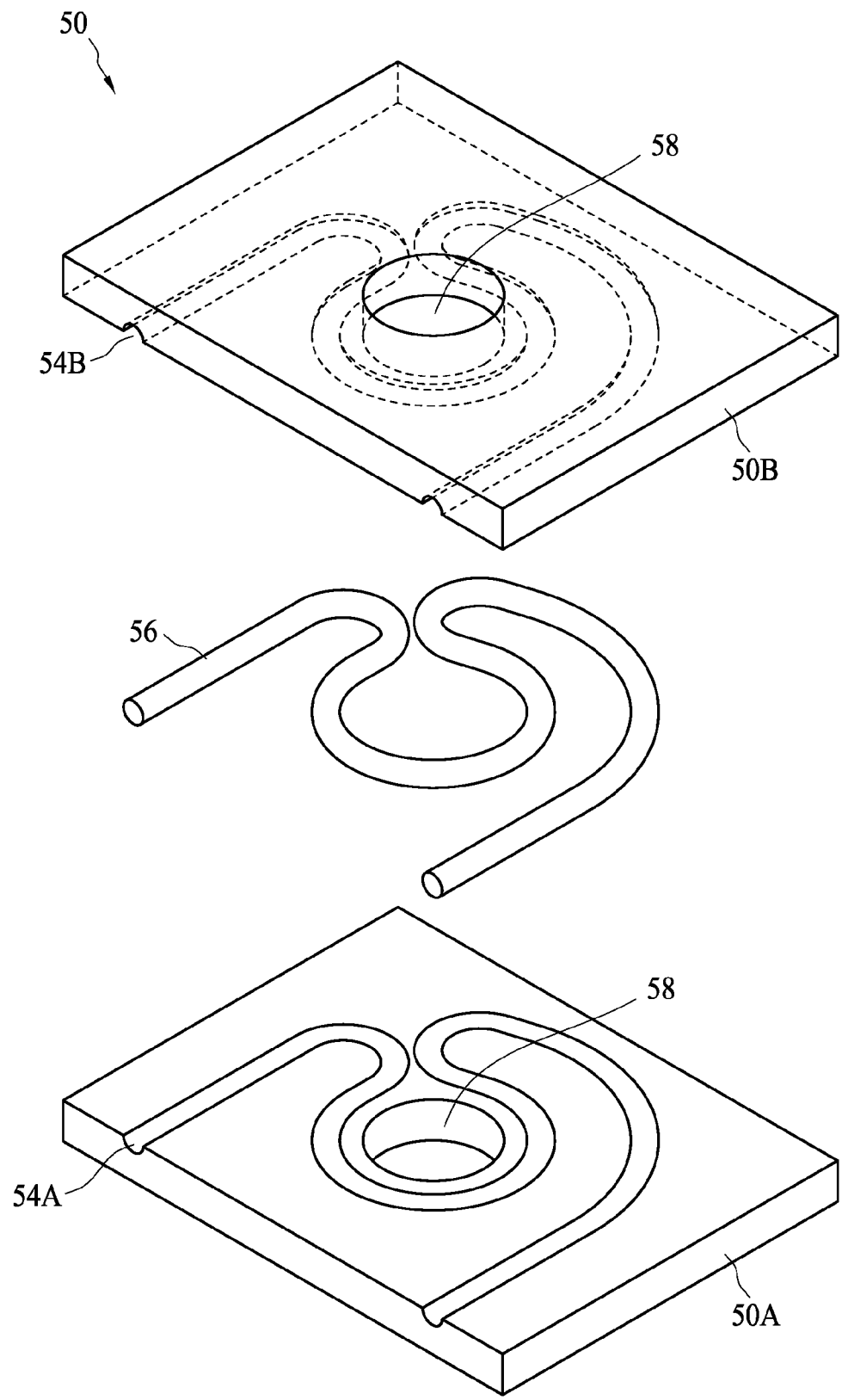
FIG. 4 illustrates new platen design according to one embodiment of the present invention.

FIG. 3 and FIG. 4 illustrate a probing apparatus 100 according to one embodiment of the present invention. The probing apparatus 100 comprises a housing 40 configured to define a testing chamber 42, a movable three-axes stand 70 positioned in the housing 40, a device holder 60 positioned in the housing 40 and configured to receive at least one semiconductor device 62 under test such as the integrated circuit device, a temperature-controller 64 such as a heater positioned in the device holder 60 and configured to control the temperature of the device holder 60, a platen 50 positioned on the housing 40 and configured to retain at least one probe card 10 by a stage 30 such as card holder, and at least one flow line 52 positioned in the platen 50, wherein the flow line 52 is configured to flow a fluid therein to adjust the temperature of the platen 50. In one embodiment of the present invention, the probe card 10 includes a circuit board 12, a supporter 14 positioned on the circuit board 12, a plurality of probes 16 positioned on the supporter 14, and a conductive through hole 20 connecting the probe 16 and a conductive wire 26. The probe 16 is fixed on the supporter 14 by epoxy resin 24.

Referring to FIG. 4, the platen 50 includes a bottom plate 50A positioned on the housing 40 and having a bottom groove 54A, and an upper plate 50B positioned on the bottom plate 50A and having an upper groove 54B. The shape and position of the upper groove 54B correspond to those of the bottom groove 54A, and a guiding tube 56 is positioned in the bottom groove 54A and the upper groove 54B. The platen 50 includes an opening 58, and the probe 16 of the probe card 10 contacts the pad of the semiconductor device 62 through the opening 58. The upper groove 54B, the bottom groove 54A, and the guiding tube 56 form the flow line 52 around the opening 58.

In one embodiment of the present invention, the flow line 52 includes at least one inlet and one outlet, and the fluid flowing in the flow line 52 can be gas, liquid, or a mixture thereof. In addition, the platen 50 may include a plurality of plates, and the flow line 52 is positioned on one of the plates. Furthermore, FIG. 2 shows that the flow line includes one guiding tube 56, and it should be appreciated by those skilled in the art that the flow line 52 may include several guiding tubes 56 with a variety of pattern designs.

The embodiment of the present invention introduces the fluid in the flow line 52 positioned in the platen 50 to limit the temperature variation of the platen 50 within an allowable range. Consequently, the flow line 52 can maintain the temperature uniformity of the platen 50, even if the three-dimensional stand 70 moves the semiconductor device 62 at a certain high or low temperature to any region of the testing chamber 42. As a result, the relative positions of the objects such as the card holder 30, the probe card 10 and the probe 16 on the platen 50 are not affected by the local thermal expansion of the platen 50 due to temperature variation.

Figure 5:
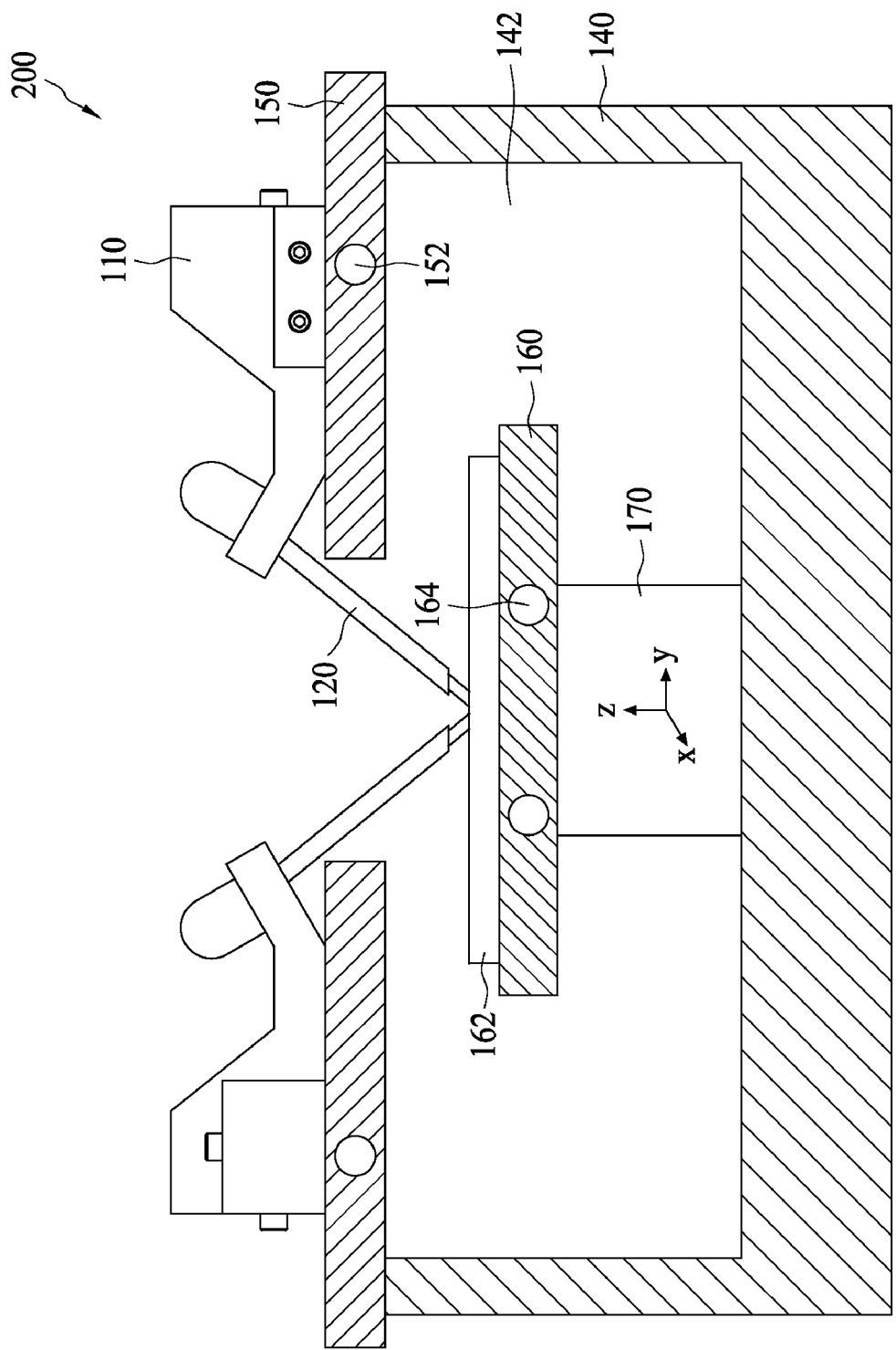
FIG. 5 illustrates a probing apparatus with adaptation of probe unit with single probes as the contacting unit.

FIG. 5 illustrates a probing apparatus 200 according to another embodiment of the present invention. The probing apparatus 200 comprises a housing 140 configured to define a testing chamber 142, a three-dimensional stand 170 positioned in the housing 140, a device holder 160 positioned in the housing 140 and configured to receive at least one semiconductor device 162 under test such as the integrated circuit device, a temperature-controller 164 such as the heater positioned in the device holder 160 and configured to control the temperature of the device holder 160, a platen 150 positioned on the housing 140 and configured to retain at least one probe 120 by a stage 110 such as a probe holder, and at least one flow line 152 positioned in the platen 150, wherein the flow line 152 is configured to flow a fluid therein to adjust the temperature of the platen 50.

According to the prior art, the movement of the device holder causes temperature variation of the testing environment, which leads to the physical dimensional change of the objects in the testing environment, altering the relative positions of the objects and precluding further electrical testing. Consequently, after the movement of the device holder, the electrical testing cannot be performed until the temperature of the testing environment reaches the stable status again so as to ensure the accuracy of the testing result.

In contrast, the embodiment of the present invention introduces the fluid in the flow line 52, 152 positioned in the platen 50, 150 to limit the temperature variation of the platen 50, 150 to within an allowable range. As a result, the positions of the objects such as the card holder 30, the probe card 10, the probe holder 110 and the probe 16, 120 on the platen 50, 150 are not affected by the local thermal expansion of the platen 50, 150 due to temperature variation.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A probing apparatus, comprising:
a housing configured to define a testing chamber;
a device holder positioned in the housing and configured to receive at least one device under test;
a temperature-controller positioned in the device holder and configured to control the temperature of the device holder;
a platen positioned on the housing and configured to retain at least one probe; and
at least one flow line positioned in the platen, wherein the flow line is configured to flow a fluid therein to adjust the temperature of the platen.

2. The probing apparatus of claim 1, wherein the temperature-controller is a heater.

3. The probing apparatus of claim 1, wherein the platen is configured to retain a probe card including the probe.

4. The probing apparatus of claim 3, wherein the platen is configured to retain a probe card by using a card holder.

5. The probing apparatus of claim 1, wherein the platen is configured to retain at least one stage, and the probe is positioned on the stage.

6. The probing apparatus of claim 1, wherein the platen includes an opening and the probe contacts the device under test through the opening.

7. The probing apparatus of claim 6, wherein the flow line is positioned around the opening of the platen.

8. The probing apparatus of claim 1, wherein the flow line includes at least one inlet and one outlet.

9. The probing apparatus of claim 1, wherein the fluid is gas, liquid, or a mixture thereof.

10. The probing apparatus of claim 1, wherein the platen includes a plurality of plates, and the flow line is positioned on one of the plates.

11. The probing apparatus of claim 1, wherein the platen includes:
a bottom plate positioned on the housing; and
an upper plate positioned on the bottom plate;
wherein one of the bottom plate and the upper plate includes a groove.

12. The probing apparatus of claim 1, wherein the platen includes:
a bottom plate positioned on the housing and having a bottom groove;
an upper plate positioned on the bottom plate and having an upper groove corresponding to the bottom groove; and
wherein the flow line is a guiding tube positioned in the bottom groove and the upper groove.

13. A probing apparatus, comprising:
a platen positioned on a testing chamber and configured to retain at least one probe, the platen including an opening and the probe contacting a device under test through the opening; and
at least one flow line positioned in the platen, wherein the flow line is configured to flow a fluid therein to adjust the temperature of the platen.

14. The probing apparatus of claim 13, wherein the platen is configured to retain a probe card including the probe.

15. The probing apparatus of claim 14, wherein the platen is configured to retain a probe card by using a card holder.

16. The probing apparatus of claim 13, wherein the platen is configured to retain at least one stage, and the probe is positioned on the stage.

17. The probing apparatus of claim 6, wherein the flow line is positioned around the opening of the platen.

18. The probing apparatus of claim 13, wherein the flow line includes at least one inlet and one outlet.

19. The probing apparatus of claim 13, wherein the fluid is gas, liquid, or a mixture thereof.

20. The probing apparatus of claim 13, wherein the platen includes a plurality of plates, and the flow line is positioned on one of the plates.

21. The probing apparatus of claim 13, wherein the platen includes:
a bottom plate positioned on the housing; and
an upper plate positioned on the bottom plate;
wherein one of the bottom plate and the upper plate includes a groove.

22. The probing apparatus of claim 13, wherein the platen includes:
a bottom plate positioned on the housing and having a bottom groove;
an upper plate positioned on the bottom plate and having an upper groove corresponding to the bottom groove; and
wherein the flow line is a guiding tube positioned in the bottom groove and the upper groove.

* * * * *